United States Patent
Shiobara

(10) Patent No.: US 9,246,448 B2
(45) Date of Patent: Jan. 26, 2016

(54) AMPLIFICATION CIRCUIT

(71) Applicant: SONY CORPORATION, Minato-ku (JP)

(72) Inventor: Hideaki Shiobara, Chiba (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/467,498

(22) Filed: Aug. 25, 2014

(65) Prior Publication Data

US 2015/0084696 A1  Mar. 26, 2015

(30) Foreign Application Priority Data

Sep. 24, 2013 (JP) ................... 2013-197332

(51) Int. Cl.
| H03F 3/26 | (2006.01) |
| H03F 3/21 | (2006.01) |
| H03F 1/30 | (2006.01) |
| H03F 1/34 | (2006.01) |
| H03F 3/181 | (2006.01) |
| H03F 3/30 | (2006.01) |
| H03F 3/45 | (2006.01) |

(52) U.S. Cl.
CPC ............... *H03F 3/211* (2013.01); *H03F 1/307* (2013.01); *H03F 1/34* (2013.01); *H03F 3/181* (2013.01); *H03F 3/3077* (2013.01); *H03F 3/3079* (2013.01); *H03F 3/45475* (2013.01); *H03F 2200/03* (2013.01); *H03F 2200/447* (2013.01); *H03F 2200/96* (2013.01); *H03F 2203/21142* (2013.01)

(58) Field of Classification Search
USPC .......................................... 330/266, 263, 271
IPC ........................................................ H03F 3/26
See application file for complete search history.

(56) References Cited

U.S. PATENT DOCUMENTS

| 3,105,198 A * | 9/1963 | Higginbotham ........ H03F 1/302 330/10 |
| 3,694,764 A * | 9/1972 | Barron .................... H03F 1/302 330/146 |
| 4,015,212 A * | 3/1977 | Miyata ................... H03F 3/3044 330/255 |
| 4,864,249 A * | 9/1989 | Reiffin ................... H03F 3/3076 330/263 |
| 5,049,834 A * | 9/1991 | Kasai ..................... H03F 1/3217 330/255 |
| 5,546,048 A * | 8/1996 | Sano ......................... H03F 1/22 330/263 |

FOREIGN PATENT DOCUMENTS

JP  2004-297746  10/2004

* cited by examiner

*Primary Examiner* — Patricia T Nguyen

(74) *Attorney, Agent, or Firm* — Oblon, McClelland, Maier & Neustadt, L.L.P.

(57) ABSTRACT

An amplification circuit includes a first power supply; a first bipolar transistor whose collector is connected to the first power supply; a first resistor one terminal of which is connected to an emitter of the first bipolar transistor; a second bipolar transistor whose collector is connected to the other terminal of the first resistor; a second power supply; a third bipolar transistor whose collector is connected to the second power supply; a second resistor one terminal of which is connected to an emitter of the third bipolar transistor; and a fourth bipolar transistor whose collector is connected to the other terminal of the second resistor. An emitter of the second bipolar transistor is directly connected to an emitter of the fourth bipolar transistor, thereby becoming an output terminal.

7 Claims, 5 Drawing Sheets

US 9,246,448 B2

AMPLIFICATION CIRCUIT

CROSS REFERENCE TO RELATED APPLICATIONS

This application claims the benefit of Japanese Priority Patent Application JP 2013-197332 filed Sep. 14, 2013, the entire contents of which are incorporated herein by reference.

BACKGROUND

The present disclosure relates to an amplification circuit.

For example, an output stage of a circuit which amplifies an audio signal or the like is configured by a circuit in which an NPN type transistor and a PNP type transistor are connected in a push-pull shape. A technology of improving a sound quality of an audio signal without using a resistor (appropriately referred to as an emitter resistor) which is connected to the emitter of each transistor of the push-pull circuit is described in Japanese Unexamined Patent Application Publication No. 2004-297746.

SUMMARY

The technology described in Japanese Unexamined Patent Application Publication No. 2004-297746 demands a circuit to be provided at two places in order to perform temperature compensation, and thus there is a problem that the circuit is complicated.

Thus, it is desirable to provide an amplification circuit which can improve a sound quality without newly adding a circuit for performing temperature compensation.

An amplification circuit according to an embodiment of the present disclosure includes, for example, a first power supply; a first bipolar transistor whose collector is connected to the first power supply; a first resistor one terminal of which is connected to an emitter of the first bipolar transistor; a second bipolar transistor whose collector is connected to the other terminal of the first resistor; a second power supply; a third bipolar transistor whose collector is connected to the second power supply; a second resistor one terminal of which is connected to an emitter of the third bipolar transistor; and a fourth bipolar transistor whose collector is connected to the other terminal of the second resistor, in which an emitter of the second bipolar transistor is directly connected to an emitter of the fourth bipolar transistor, thereby becoming an output terminal.

According to the embodiment, it is possible to provide an amplification circuit which does not use an emitter resistor on a signal path of an audio signal or the like. In addition, the effects described herein are not necessarily limited thereto, and may be any one of the effects described in the present disclosure. In addition, the content of the present disclosure is not intended to be construed so as to be limited by the illustrated effects.

DETAILED DESCRIPTION OF EMBODIMENTS

Hereinafter, an embodiment of the present disclosure will be described with reference to the drawings. In addition, the description will be made in the following sequence.

1. Embodiment
2. Modification Example

An embodiment described below is a preferred specific example, and the content of the present disclosure is not limited to such embodiments or the like.

1. Embodiment

With Regard to Configuration of General Amplification Circuit

Figure 1:
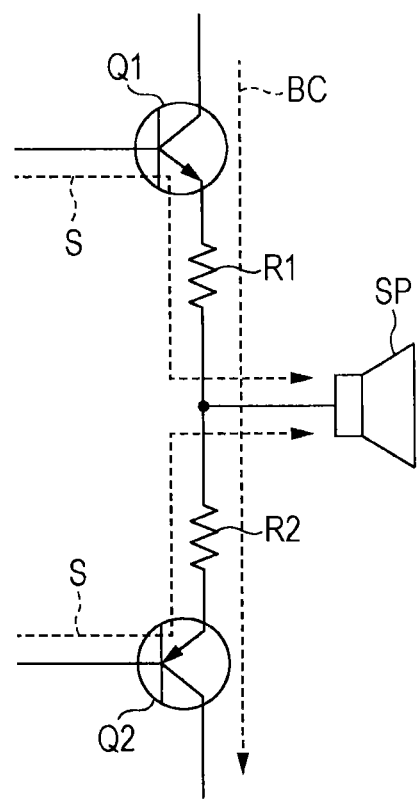
FIG. 1 is a diagram illustrating an example of the configuration of an output stage of a general amplification circuit.

For easy understanding of the present disclosure, an example of a configuration of a general amplification circuit will be described with reference to FIG. 1 and FIG. 2. FIG. 1 illustrates the example of the circuit configuration of an output stage of a general amplification circuit. The circuit illustrated in FIG. 1 is a so-called single-ended push-pull, and an NPN type bipolar transistor (briefly, referred to as transistor) Q1 and a PNP type transistor Q2 are connected in series via a resistor R1 and a resistor R2. The resistor R1 is an emitter resistor which is connected to the emitter of the transistor Q1. The resistor R2 is an emitter resistor which is connected to the emitter of the transistor Q2.

A junction of the emitter resistor R1 and the emitter resistor R2 is a point that is an output terminal from which a signal is output, and for example, a speaker SP is connected to the output terminal. In the circuit illustrated in FIG. 1, when an input signal S is in a positive cycle, the transistor Q1 is turned on, which causes an amplification signal to be output, and when the input signal S is in a negative cycle, the transistor Q2 is turned on, which causes an amplification signal to be output. The input signal S is, for example, an audio signal (signal corresponding to various sounds which can be heard by a human ear, such as voices of people and music), and more specifically, one channel signal of two channel (LR) audio signals. In addition, in FIG. 1, a dotted line BC which passes through the emitter resistor R1, the emitter resistor R2, and the transistor Q2 from the transistor Q1 represents a bias current (idling current).

The configuration of the output stage of the amplification circuit is not limited to the circuit illustrated in FIG. 1. For example, as illustrated in FIG. 2, the output stage of the amplification circuit may be a configuration (parallel push-pull) in which a plurality of the circuits illustrated in FIG. 1 is connected in parallel. By the configuration of the parallel push-pull, a large output can be generated.

Figure 2:
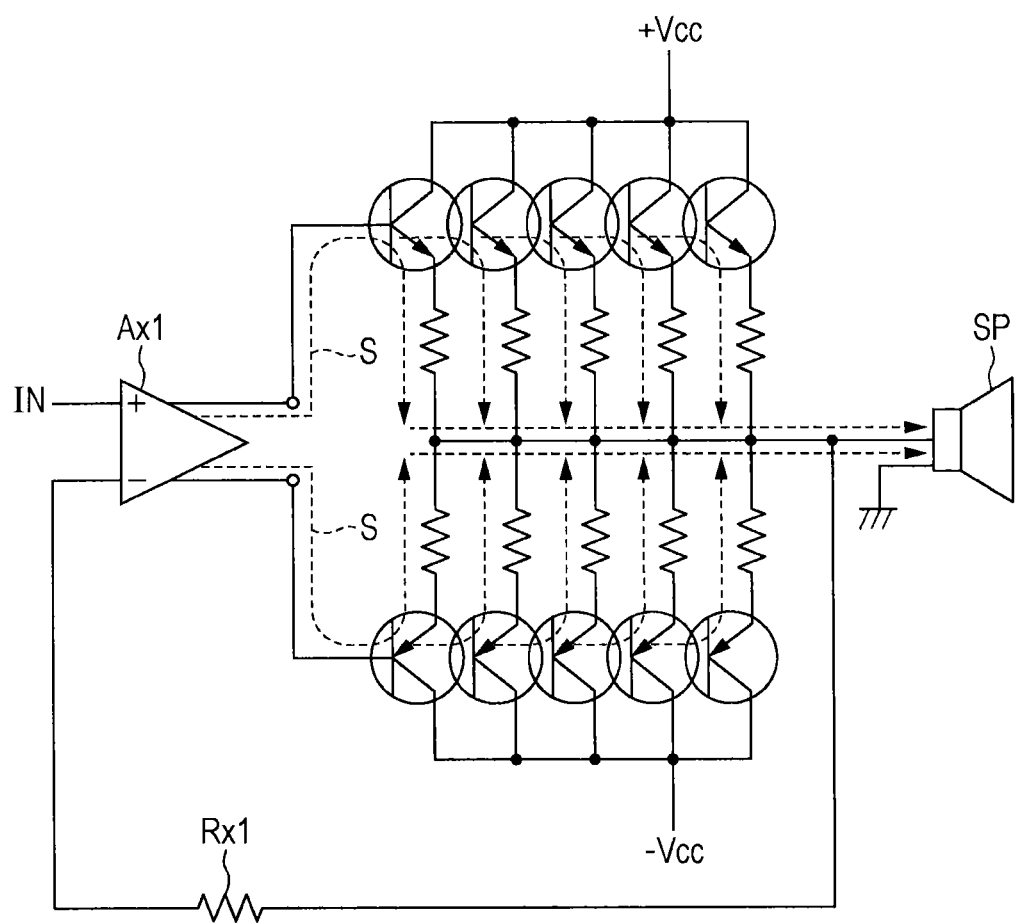
FIG. 2 is a diagram illustrating an example of the configuration of a parallel push-pull of a general amplification circuit.

In addition, FIG. 2 illustrates a voltage amplifier Ax1 such as an operational amplifier for amplifying a voltage of the input signal S, and a configuration in which negative feedback is applied to a negative terminal of the voltage amplifier Ax1. Such an example has a configuration in which a signal output from an output stage of an amplification circuit is input to the negative terminal of the voltage amplifier Ax1 via a feedback resistor Rx1.

With Regard to Emitter Resistor

As an emitter resistor which is used in the amplification circuit, for example, a metal plate resistor in which a metal plate is fixed with cement, or a winding resistor is used. A resistance value of the emitter resistor is set so as to be a significantly small value (for example, approximately 0.01Ω to 1Ω).

Herein, several reasons why the emitter resistor is necessary in a circuit of the output stage of the amplification circuit will be described. As the reason for demanding the emitter resistor, the following three points can be exemplified, for example.

1. A bias current is thermally stabilized, and a thermal runaway is prevented.

2. In a case where an output of the amplification circuit is shorted, the transistor is protected.

3. While a circuit configured by the parallel push-pull operates, losses (collector losses) occurring in each transistor are uniform. That is, a current intensively flowing into a specific transistor due to variations in characteristics of the transistor is prevented.

In this way, the emitter resistor is demanded, but since the emitter resistor is inserted in series in the output of the amplification circuit and a load (speaker in this example), power loss due to the emitter resistor is great. In addition, since an L component (coil component) is included in the metal plate which is used for the metal plate resistor, the winding resistor, or the like, there is a possibility that a change in timbre, or the like may occur due to the L component, a sound quality may degrade, and strain may increase.

Due to such a problem, it is preferable that a circuit without an emitter resistor be used in the output stage of the amplification circuit. Such a circuit is described in Japanese Unexamined Patent Application Publication No. 2004-297746 described above. However, as described above, the technology described in Japanese Unexamined Patent Application Publication No. 2004-297746 demands multiple circuits for compensating for the temperature, and the circuit is complicated. Furthermore, in the same manner as the technology described in Japanese Unexamined Patent Application Publication No. 2004-297746, only removing the emitter resistor may not satisfy the second reason for demanding the above-described emitter resistor.

Furthermore, in order to satisfy the third reason for demanding the emitter resistor without the emitter resistor in the circuit configured by the parallel push-pull, it is necessary to use a transistor with a particular characteristic. However, it is difficult to use a transistor with variable characteristics. In addition, even if each transistor maintains the particular characteristic at the time of starting to be used, there is a possibility that the characteristics of each transistor may become non-uniform due to secular changes or the like.

From such a viewpoint, it is considered that the output stage of the amplification circuit is configured with a circuit in which metal oxide field effect transistors (MOSFET) with different polarities from each other are connected in series, as an assumed technology (no technology in the related art). Since the MOSFET has a negative temperature characteristic (if the temperature increases, the resistance increases), it is not necessary to provide a configuration corresponding to the emitter resistor. However, the MOSFET is expensive, and thus there is a possibility that a cost may increase. From such a viewpoint, one embodiment of the present disclosure will be described.

With Regard to Outline of Embodiment According to the Present Disclosure

Figure 3:
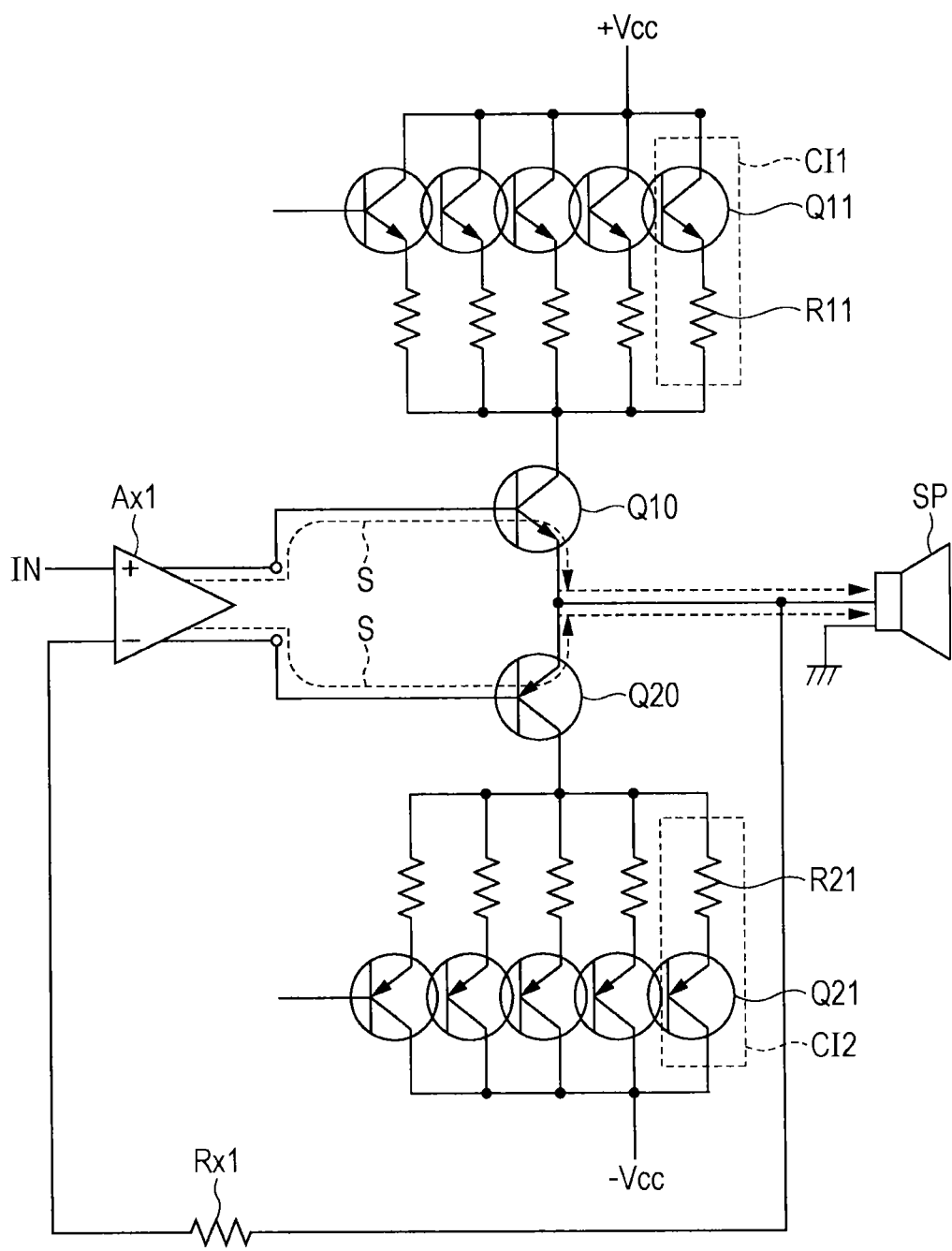
FIG. 3 is a diagram illustrating an outline of an amplification circuit according to an embodiment of the present disclosure.

FIG. 3 is a diagram illustrating an outline of an embodiment according to the present disclosure. An output stage of an amplification circuit according to the embodiment is configured with a single push-pull in which an NPN type transistor Q10 and a PNP type transistor Q20 are connected in series without passing through an element such as an emitter resistor. In addition, a connection not passing through the element such as the emitter resistor is appropriately called a direct connection. Specifically, the emitter of the transistor Q10 is connected to the emitter of the transistor Q20. A junction of the transistor Q10 and the transistor Q20 which are directly connected is an output terminal, and for example, the speaker SP is connected to the output terminal.

A positive power supply (+Vcc) is connected to the transistor Q10 via a circuit CI1 which is configured with a transistor Q11 and a resistor R11. In addition, in FIG. 3, the same circuits as the circuit CI1 are connected in parallel with the circuit CI1 between the positive power supply and the transistor Q10 so as to be able to generate a large output, but there may be only the circuit CI1 for a small output amplifier. The collector of the transistor Q11 is connected to the positive power supply. The emitter of the transistor Q11 is connected to one terminal of the resistor R11. The other terminal of the resistor R11 is connected to the collector of the transistor Q10. The other circuits are connected in the same manner as the circuit CI1.

A constant voltage circuit is formed by a configuration that includes the transistors (for example, the transistor Q10 and the transistor Q11) which are connected in series, and a collector-emitter voltage Vce of the transistor Q10 is maintained as a minimum demanding voltage (constant potential). The collector-emitter voltage Vce of the transistor Q10 becomes a constant voltage of 5 V (volts), for example.

Meanwhile, a negative power supply (−Vcc) is connected to the transistor Q20 via a circuit CI2 which is configured with a transistor Q21 and a resistor R21. In addition, in FIG. 3, the same circuits as the circuit CI2 are connected in parallel with the circuit CI2 between the negative power supply and the transistor Q20 so as to be able to generate a large output, but there may be only the circuit CI2 for a small output amplifier. The collector of the transistor Q21 is connected to the negative power supply. The emitter of the transistor Q21 is connected to one terminal of the resistor R21. The other terminal of the resistor R21 is connected to the collector of the transistor Q20. The other circuits are also connected in the same manner as the circuit CI2.

A constant voltage circuit is formed by a configuration that includes the transistors (for example, the transistor Q20 and the transistor Q21) which are connected in series, and a collector-emitter voltage Vce of the transistor Q20 is maintained as a minimum demanding voltage (constant potential). The collector-emitter voltage Vce of the transistor Q20 becomes a constant voltage of 5 V (volts), for example.

By the configuration according to the embodiment illustrated in FIG. 3, losses of the transistors Q10 and Q20 are extremely low, and the emitter resistor on a path of the input signal S can be removed. Thus, it is possible to prevent a sound quality from decreasing due to an existence of the emitter resistor. Since the transistors (transistor Q10 and transistor Q20) for amplifying the input signal have low losses, it is not necessary for the transistors to be configured by the parallel push-pull. That is, the circuit can be configured by a single push-pull, and the problem which can occur in a configuration of the parallel push-pull and in which a current is concentrated on a specified transistor, does not occur.

Resistors connected to each of the collectors of the transistor Q10 and the transistor Q20 function as an emitter resistor in a general amplification circuit. As a result, in a case where the output of the amplification circuit is shorted, a transitional overcurrent state can be limited by a transistor and a resistor on a collector side of the transistor Q10 and by a transistor and a resistor on a collector side of the transistor Q20, and it is possible to prevent a thermal runaway from occurring. In addition, in association with a constant voltage of the transistor Q10 and the transistor Q20, it is possible to reliably prevent the thermal runaway from occurring. It is also not necessary to newly provide a circuit for temperature compensation.

Figure 4:
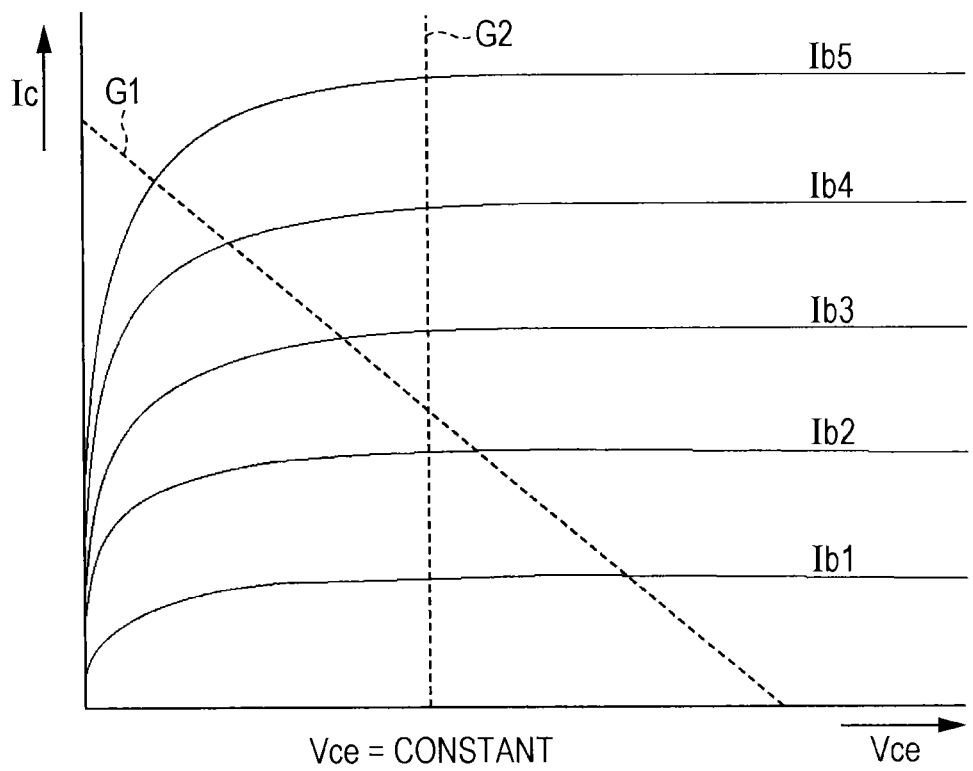
FIG. 4 is a diagram illustrating an example of load lines of a transistor in an output stage.

FIG. 4 is a diagram illustrating load lines of the transistor Q10 (as well as the transistor Q20). In FIG. 4, a vertical axis denotes a collector current Ic, and a horizontal axis denotes the collector-emitter voltage Vce. In addition, in FIG. 4, a dotted line G1 denotes the load line of a general circuit, and a dotted line G2 denotes the load line of the amplification circuit according to one embodiment.

A point at which characteristic curves of Ic and Vce with respect to a base current Ib intersect with the load line becomes an operating point of the transistor Q10. Since the load line of the general circuit has a slope, there is a case where it is difficult to set the operating point in a linear area of the characteristic curve. In contrast, since Vce is constant in the circuit according to the one embodiment, it is possible for the operating point to be set in the linear area of the characteristic curve, by appropriately setting Vce. In addition, since Vce is constant, it is possible to decrease signal distortion due to the Early effect.

In addition, by directly connecting the transistor Q10 to the transistor Q20, it is possible to prevent switching mismatch of each transistor from increasing. In addition, when the transistor Q10 (as well as the transistor Q20) operates with constant Vce, a change of a collector capacitance (cob) of the transistor caused by the change of a Vce is completely eliminated, and it is possible to have a constant high band characteristic and also to suppress a change of the phase of a signal.

Since each emitter terminal of the transistor Q10 and the transistor Q20 is directly connected to the output terminal, improvement of a damping factor in a bare property which does not depend on a negative feedback (NFB) is obtained. In addition, since a change of heat generation according to the amplitude of the input signal is small, it is possible to obtain a sound quality with an excellent linearity.

Example of Circuit Configuration of Amplification Circuit

Figure 5:
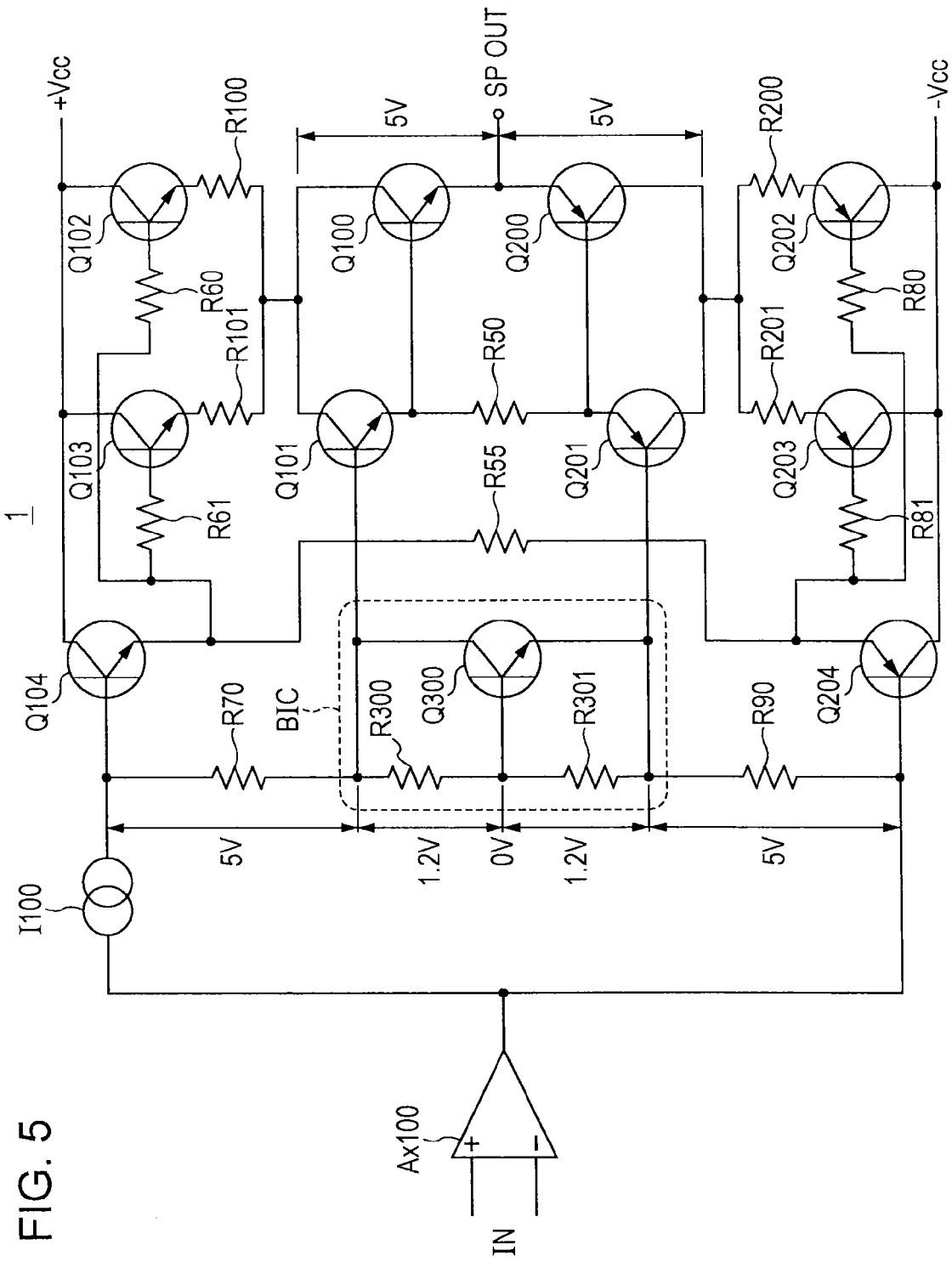
FIG. 5 is a diagram illustrating an example of a circuit configuration of an amplification circuit according to an embodiment of the present disclosure.

FIG. 5 illustrates an example of a circuit configuration of an amplification circuit according to the embodiment. The amplification circuit 1 is configured to include, for example, a voltage amplifier Ax100 such as an operational amplifier, a constant current circuit I100, a plurality of transistors, and a plurality of resistors which are connected to each other.

The plurality of transistors include NPN type transistors Q100, Q101, Q102, Q103, Q104 and Q300, and PNP type transistors Q200, Q201, Q202, Q203 and Q204, for example. The plurality of resistors include resistors R50, R55, R60, R61, R70, R80, R81, R90, R100, R101, R200, R201, R300, and R301, for example.

Here, the transistor Q102 and the transistor Q103 correspond to one example of a first bipolar transistor. The transistor Q100 corresponds to one example of a second bipolar transistor. The transistor Q202 and the transistor Q203 correspond to one example of a third bipolar transistor. The transistor Q200 corresponds to one example of a fourth bipolar transistor. The transistor Q104 corresponds to one example of a fifth bipolar transistor. The transistor Q204 corresponds to one example of a sixth bipolar transistor.

Here, the resistor R100 and the resistor R101 correspond to one example of a first resistor. The resistor R200 and the resistor R201 correspond to one example of a second resistor. The resistor R70 corresponds to one example of a third resistor. The resistor R90 corresponds to one example of a fourth resistor.

A positive power supply (+Vcc) and a negative power supply (−Vcc) in which voltage values are the same and polarities are reverse are supplied to the amplification circuit 1. The positive power supply is one example of a first power supply, and the negative power supply is one example of a second power supply. For example, in a case of an amplifier with an output of 100 W, a power supply of 50 V is supplied. An input signal "in" such as an audio signal output from a signal source (not illustrated) is input to the amplification circuit 1. Then, the input signal "in" is amplified by the amplification circuit 1, and is output as an output signal "out". The output signal "out" is supplied to a load such as a speaker or headphones.

A circuit configuration of the amplification circuit 1 will be specifically described. The transistors Q100 and Q101 are Darlington-connected, thereby configuring an emitter follower circuit. That is, the emitter of the transistor Q101 in a first stage is connected to the base of the transistor Q100 in a final stage. Thus, a current amplification rate of the emitter follower circuit is obtained by multiplying a current amplification rate of the transistor Q101 by a current amplification rate of the transistor Q100, and a power transistor which can output a large current is configured.

Similarly, the transistors Q200 and Q201 are also Darlington-connected, thereby configuring another emitter follower circuit. That is, the emitter of the transistor Q201 in the first stage is connected to the base of the transistor Q200 in the final stage. Thus, a current amplification rate of another emitter follower circuit is obtained by multiplying a current amplification rate of the transistor Q201 by a current amplification rate of the transistor Q200, and another power transistor which can output a large current is configured. The emitter of the transistor Q101 is connected to the emitter of the transistor Q201 via the resistor R50.

The transistor Q100 and the transistor Q200 in the final stage are complementary semiconductor elements having approximately the same characteristics with respect to parameters, temperature or the like. Similarly, the transistor Q101 and the transistor Q201 in a preceding stage thereof are also complementary semiconductor elements having approximately the same characteristics with respect to parameters, temperature or the like. The transistors Q100 and Q101 turn on while the audio signal which is input is in a positive period, and thereby the audio signal is amplified. Meanwhile, the transistors Q200 and Q201 turn on while the audio signal which is input is in a negative period, and thereby the audio signal is amplified.

In addition, three or more of NPN type transistors and PNP type transistors may be Darlington-connected in multiple stages. The transistors which are Darlington-connected in multiple stages can also be regarded as a single transistor in which a current amplification rate and an input impedance are represented by a multiplication of the number of stages. In addition, the output stage may be formed by a configuration in which a single NPN type transistor and a single PNP type transistor are connected in a push-pull shape.

A circuit configured by a transistor and a resistor is inserted between the positive power supply and the collector of the transistor Q100. In such an example, a plurality of circuits each being configured by a transistor and a resistor are connected in parallel in such a manner that the amplification circuit 1 can generate a large output. Specifically, a circuit which is configured by the transistor Q102 and the resistor R100 is connected in parallel to a circuit configured by the transistor Q103 and the resistor R101.

The collector of the transistor Q102 is connected to the positive power supply. One terminal of the resistor R100 is connected to the emitter of the transistor Q102. The other terminal of the resistor R100 is connected to the collector of the transistor Q100.

The collector of the transistor Q103 is connected to the positive power supply. One terminal of the resistor R101 is connected to the emitter of the transistor Q103. The other terminal of the resistor R101 is connected to the collector of the transistor Q100.

The base of the transistor Q102 is connected to the emitter of the transistor Q104 via the resistor R60. The base of the transistor Q103 is connected to the emitter of the transistor Q104 via the resistor R61.

A circuit configured by a transistor and a resistor is inserted between the negative power supply and the collector of the transistor Q200. In such an example, a plurality of circuits each being configured by a transistor and a resistor are connected in parallel in such a manner that the amplification circuit 1 can generate the large output. Specifically, a circuit configured by the transistor Q202 and the resistor R200 is connected in parallel to a circuit configured by the transistor Q203 and the resistor R201.

The collector of the transistor Q202 is connected to the negative power supply. One terminal of the resistor R200 is connected to the emitter of the transistor Q202. The other terminal of the resistor R200 is connected to the collector of the transistor Q200.

The collector of the transistor Q203 is connected to the negative power supply. One terminal of the resistor R201 is connected to the emitter of the transistor Q203. The other terminal of the resistor R201 is connected to the collector of the transistor Q200.

The base of the transistor Q202 is connected to the emitter of the transistor Q204 via the resistor R80. The base of the transistor Q203 is connected to the emitter of the transistor Q204 via the resistor R81. The emitter of the transistor Q104 is connected to the emitter of the transistor Q204 via the resistor R55.

The collector of the transistor Q104 is connected to the positive power supply. The collector of the transistor Q204 is connected to the negative power supply. The transistor Q104 (as well as the transistor Q204) is provided in such a manner that a capacitive component of each transistor does not adversely affect the voltage amplifier Ax100, and in addition, in such a manner that an amplification rate greater than a combination of the amplification rate of the transistor Q102 or the like can be obtained.

The constant current circuit I100 is connected to the output stage of the voltage amplifier Ax100. A constant current of 10 mA (milliamperes), for example, is generated by the constant current circuit I100. For example, the voltage amplifier Ax100 amplifies an input signal with a voltage amplitude of 150 mV (millivolts) at an amplification rate of 100 times. The resistor R70, the bias circuit BIC, and the resistor R90 are connected to the constant current circuit I100. The base of the transistor Q104 is connected to a junction of the constant current circuit I100 and the resistor R70. The base of the transistor Q204 is connected to an output of the current flowing through the resistor R90.

The bias circuit BIC is a circuit for applying bias voltages to the transistors Q100, Q101, Q200, and Q201. For example, the bias circuit BIC includes the resistor R300 and the resistor R301 which are connected in series, and includes the transistor Q300 whose base is connected to a junction of the resistor R300 and the resistor R301. For example, a constant voltage circuit configured by the resistor R300, R301, and the transistor Q300 configures the bias circuit BIC. For example, a bias voltage of 1.2 V is generated by the bias circuit BIC.

Example of Operation of Amplification Circuit

An example of a main operation of the amplification circuit 1 will be described. Hereinafter, an operation on a plus side in the amplification circuit 1 will be mainly described, but an operation on a side in the amplification is the same as in the plus side. By a current output from the constant current circuit I100 and the resistor R70, a bias voltage for at least the transistor Q102 and the transistor Q103 is generated. In a configuration of the amplification circuit 1 according to the embodiment, by the current output from the constant current circuit I100 and the resistor R70, a bias voltage for the transistor Q104 is further generated. For example, a resistance value of the resistor R70 is appropriately set in such a manner that a bias voltage of a dc voltage of 5 V is generated. For example, the resistor R70 (as well as R90) is set to 500Ω.

Here, the bias voltage which is generated by the bias circuit BIC is set to 1.2 V, and each base-emitter voltage Vbe of the transistors Q104, Q103, and Q102 is set to 0.6 V. A voltage drop of 5 V is generated at both terminals of the resistor R70. A value (5 V) which is obtained by subtracting a total (1.2 V) of the base-emitter voltages Vbe of each of the transistors Q104 and Q103 (Q102) from 6.2 V which is obtained by adding the bias voltage 1.2 V to 5 V, becomes a collector-emitter voltage Vice of the transistor Q100. That is, the voltage at both terminals of the transistor Q100 becomes a constant voltage of 5.0 V. For the same reason as above, a voltage at both terminals of the transistor Q200 can be a constant voltage of, for example, 5.0 V.

In addition, since the transistors Q102, Q103, Q202, and Q203 generate heat, and resistors corresponding to the emitter resistor are connected to each emitter of the transistors, it is possible to prevent the heat runaway from occurring. Furthermore, since the emitter resistor does not exist on the path of the audio signal (ac signal), it is possible to prevent the sound quality from degrading. In a case where since flowing of a signal is simple in the illustrated amplification circuit, the amplification circuit is embedded and print-patterned, the circuit of the audio signal can be combined in a shortest path. One example of the other effects is the same as described above.

In addition, for example, by a configuration in which a negative feedback of the output signal "out" to the voltage amplifier Ax100 is performed, a bias voltage (5 V in the above-described example) for the transistor Q102 or the like may be generated. However, since there is a possibility that an oscillation may be generated by the negative feedback and an operation of the amplification circuit 1 may become unstable, it is preferable that the bias voltage be generated on an input side of the amplification circuit. In addition, the bias voltage may be generated by a battery or the like.

2. Modification Example

As described above, the embodiment of the present disclosure is specifically described, but the present disclosure is not limited to the above-described embodiment, and can be modified in various manners based on a technical spirit of the present disclosure.

For example, the transistor in the amplification circuit is not limited to a bipolar transistor. That is, a word indicating the bipolar transistor described in a scope of claims has a concept which includes a transistor with characteristics similar to the characteristics of the bipolar transistor, in addition to the bipolar transistor, for example, an insulated gate bipolar transistor (IGBT).

The configuration of the amplification circuit according to the embodiment, the numerical values described above, or the like can be appropriately modified within a range in which technical contradiction does not occur.

The present disclosure can also employ the following configurations.

(1) An amplification circuit including: a first power supply; a first bipolar transistor whose collector is connected to the first power supply; a first resistor one terminal of which is connected to an emitter of the first bipolar transistor; a second bipolar transistor whose collector is connected to the other terminal of the first resistor; a second power supply; a third bipolar transistor whose collector is connected to the second power supply; a second resistor one terminal of which is connected to an emitter of the third bipolar transistor; and a fourth bipolar transistor whose collector is connected to the other terminal of the second resistor, in which an emitter of the second bipolar transistor is directly connected to an emitter of the fourth bipolar transistor, thereby becoming an output terminal.

(2) The amplification circuit described in (1), in which a bias voltage for the first bipolar transistor and the third bipolar transistor is generated on an input side of the amplification circuit.

(3) The amplification circuit described in (2), further including: a voltage amplifier which amplifies a voltage of an input signal; and a constant current circuit which is connected to an output side of the voltage amplifier, in which a third resistor, a bias circuit which generates a bias voltage for the second bipolar transistor and the fourth bipolar transistor, and a fourth resistor are connected to the constant current circuit, in which a bias voltage for the first bipolar transistor is generated by a voltage which is generated at both terminals of the third resistor, and in which a bias voltage for the third bipolar transistor is generated by a voltage which is generated at both terminals of the fourth resistor.

(4) The amplification circuit described in (3), further including: a fifth bipolar transistor whose base is connected to a junction of the constant current circuit and the third resistor, whose collector is connected to the first power supply, and whose emitter is connected to a base of the first bipolar transistor; and a sixth bipolar transistor whose base is connected to a junction of the constant current circuit and the fourth resistor, whose collector is connected to the second power supply, and whose emitter is connected to a base of the third bipolar transistor.

(5) The amplification circuit described in any one of (1) to (4), in which a collector-emitter voltage of the second bipolar transistor and a collector-emitter voltage of the fourth bipolar transistor are constant voltages.

(6) The amplification circuit described in any one of (1) to (5), in which a circuit which is configured by the first bipolar transistor and the first resistor is connected in parallel between the first power supply and the second bipolar transistor, and in which a circuit which is configured by the third bipolar transistor and the second resistor is connected in parallel between the second power supply and the fourth bipolar transistor.

(7) The amplification circuit described in any one of (1) to (6), in which the first bipolar transistor and the second bipolar transistor are NPN type bipolar transistors, and in which the third bipolar transistor and the fourth bipolar transistor are PNP type bipolar transistors.

It should be understood by those skilled in the art that various modifications, combinations, sub-combinations and alterations may occur depending on design requirements and other factors insofar as they are within the scope of the appended claims or the equivalents thereof.

What is claimed is:

1. An amplification circuit comprising:
   a first power supply;
   a first bipolar transistor whose collector is connected to the first power supply;
   a first resistor one terminal of which is connected to an emitter of the first bipolar transistor;
   a second bipolar transistor whose collector is connected to the other terminal of the first resistor;
   a second power supply;
   a third bipolar transistor whose collector is connected to the second power supply;
   a second resistor one terminal of which is connected to an emitter of the third bipolar transistor; and
   a fourth bipolar transistor whose collector is connected to the other terminal of the second resistor,
   wherein an emitter of the second bipolar transistor is directly connected to an emitter of the fourth bipolar transistor, thereby becoming an output terminal.

2. The amplification circuit according to claim 1,
   wherein a bias voltage for the first bipolar transistor and the third bipolar transistor is generated on an input side of the amplification circuit.

3. The amplification circuit according to claim 2, further comprising:
   a voltage amplifier which amplifies a voltage of an input signal; and
   a constant current circuit which is connected to an output side of the voltage amplifier,
   wherein a third resistor, a bias circuit which generates a bias voltage for the second bipolar transistor and the fourth bipolar transistor, and a fourth resistor are connected to the constant current circuit,
   wherein a bias voltage for the first bipolar transistor is generated by a voltage which is generated at both terminals of the third resistor, and
   wherein a bias voltage for the third bipolar transistor is generated by a voltage which is generated at both terminals of the fourth resistor.

4. The amplification circuit according to claim 3, further comprising:
   a fifth bipolar transistor whose base is connected to a junction of the constant current circuit and the third resistor, whose collector is connected to the first power supply, and whose emitter is connected to a base of the first bipolar transistor; and
   a sixth bipolar transistor whose base is connected to a junction of the constant current circuit and the fourth resistor, whose collector is connected to the second power supply, and whose emitter is connected to a base of the third bipolar transistor.

5. The amplification circuit according to claim 1,
   wherein a collector-emitter voltage of the second bipolar transistor and a collector-emitter voltage of the fourth bipolar transistor are constant voltages.

6. The amplification circuit according to claim 1,
   wherein a circuit which is configured by the first bipolar transistor and the first resistor is connected in parallel between the first power supply and the second bipolar transistor, and wherein a circuit which is configured by the third bipolar transistor and the second resistor is connected in parallel between the second power supply and the fourth bipolar transistor.

7. The amplification circuit according to claim 1,
wherein the first bipolar transistor and the second bipolar transistor are NPN type bipolar transistors, and
wherein the third bipolar transistor and the fourth bipolar transistor are PNP type bipolar transistors.

\* \* \* \* \*